United States Patent
Sudoh

(10) Patent No.: US 7,218,462 B2
(45) Date of Patent: May 15, 2007

(54) HOLDING MECHANISM, OPTICAL APPARATUS AND DEVICE MANUFACTURING METHOD

(75) Inventor: Yuji Sudoh, Hadano (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/235,110

(22) Filed: Sep. 27, 2005

(65) Prior Publication Data

US 2006/0066963 A1    Mar. 30, 2006

(30) Foreign Application Priority Data

Sep. 28, 2004   (JP)   ............... 2004-280997

(51) Int. Cl.
*G02B 7/02* (2006.01)
*G03B 3/10* (2006.01)
*H04N 5/225* (2006.01)

(52) U.S. Cl. .............. 359/811; 359/819; 359/822; 359/825; 396/134; 348/373

(58) Field of Classification Search ............ 359/811, 359/819, 822, 825, 232, 198, 200; 396/24, 396/134, 506; 348/373, 143, 163, 483; 250/310, 250/311, 440.11, 442.11; 74/10.6, 10.54, 74/10.85

See application file for complete search history.

(56) References Cited

U.S. PATENT DOCUMENTS

| | | | |
|---|---|---|---|
| 6,507,446 B2 * | 1/2003 | Yamashita et al. | 359/811 |
| 6,829,107 B2 * | 12/2004 | Osterried | 359/811 |
| 6,982,841 B2 * | 1/2006 | Kino et al. | 359/822 |
| 7,006,308 B2 * | 2/2006 | Sudoh | 359/819 |

FOREIGN PATENT DOCUMENTS

| | | |
|---|---|---|
| JP | 3-96609 | 10/1991 |
| JP | 2002-48962 | 2/2002 |

* cited by examiner

*Primary Examiner*—Loha Ben
(74) *Attorney, Agent, or Firm*—Fitzpatrick, Cella, Harper & Scinto

(57) ABSTRACT

A holding mechanism for holding an optical element includes a rear side block that includes a rear side holding engagement part that is engageable with a rear side engagement part provided on a rear side of an optical element, a front side block that is coupled with the rear side block and includes a front side holding engagement part that is engageable with a front engagement part provided on a front side of the optical element or the holding member, wherein one of the rear side engagement part and the rear side holding engagement part has a groove and the other has a spherical part that has an at least partially spherical shape engageable with the groove, and wherein one of the front side engagement part and the front side holding engagement part has another groove, and the other has another spherical part that has an at least partially spherical shape engageable with the other groove.

9 Claims, 10 Drawing Sheets

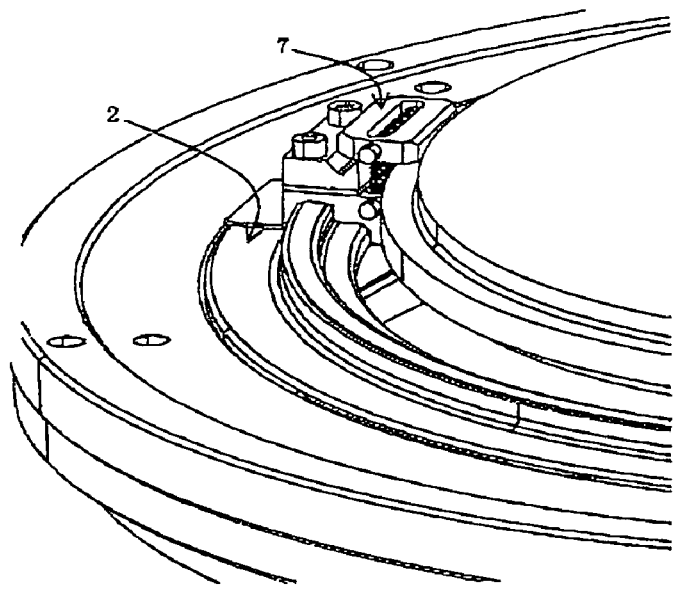
FIG. 5A
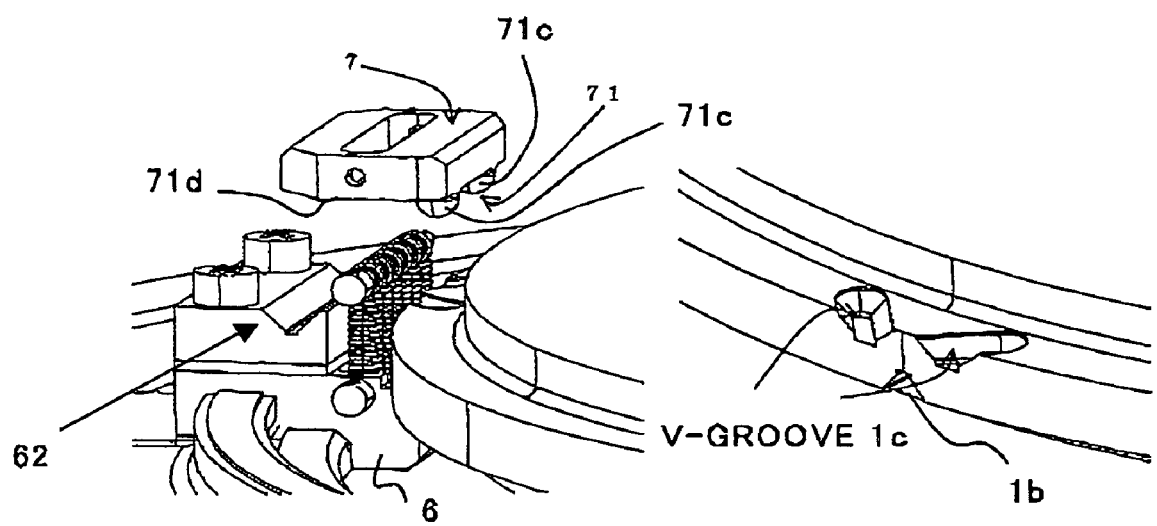
FIG. 5B
FIG. 5C

HOLDING MECHANISM, OPTICAL APPARATUS AND DEVICE MANUFACTURING METHOD

BACKGROUND OF THE INVENTION

The present invention relates to a holding mechanism of an optical element, an optical apparatus, such as an exposure apparatus, which uses the holding mechanism, and a device manufacturing method. The present invention is suitable, for example, for a holding mechanism that holds the optical element, such as a lens and a mirror, used for a semiconductor exposure apparatus.

The semiconductor exposure apparatus is an apparatus that transfers an original (such as a reticle), which has a circuit pattern, onto a substrate (such as a silicon wafer). A projection lens is used to transfer or image the reticle pattern onto the wafer, and should have a high resolving power so as to manufacture highly integrated circuits. Thus, a lens in the semiconductor exposure apparatus needs to have reduced aberration, uniformities of various characteristics relating to the glass material and film, and working and assembly precisions of the glass surface shape.

A barrel that holds the lens and/or mirror is generally made of metal or another material different from glass. FIG. 9 is a partially sectional and perspective view of a barrel structure for an optical system in a conventional semiconductor exposure apparatus. In FIG. 9, plural lenses 101 and 102 are fixed onto and supported by metal frames 103 and 104. These metal frames 103 and 104 are stacked in a cylindrical holding member 105 through air gap adjusting spacers 106, and pressed and fixed from the top by pressure screw rings 107 and 108. Japanese Utility Model Application, Publication No. 3-96609, for example, discloses a method for fixing an optical element without adhesive. Japanese Patent Application, Publication No. 2002-48962, for example, discloses a lens structure that has a circumferential notch and attempts to remove a distortion of the lens effective diameter.

Some optical apparatuses, such as a projection optical system in a semiconductor exposure apparatus, need a high optical characteristic. In order to minimize a deformation of an optical element and the deterioration of its optical characteristic due to the external force, each optical element, such as a lens, in the optical system, is usually fixed by adhesive that has little shrinkage on curing, onto a metal frame without applying the external force to the optical element. Nevertheless, exposure that uses a laser with a short wavelength might cause gas emissions from the adhesive, contaminating the optical element surface, and deteriorating the transmittance and the optical characteristics. In exchanging each optical element during manufacturing/maintenance of the exposure apparatus, steps of peeling off adhesive and reapplying the adhesive deteriorate the yield.

Japanese Utility Model Application, Publication No. 3-96609, discloses a method of fixing an optical element without adhesive. However, the groove formed in the glass and a spherical member that contacts the groove cannot fix the lens in the optical-axis direction and may shift the lens due to the acceleration perpendicular to the optical axis. One solution for this problem is to apply a large power to the top surface of the lens, but this power would consequently deform the lens and generate greater birefringence in the lens.

BRIEF SUMMARY OF THE INVENTION

With the foregoing in mind, the present invention is directed to a holding mechanism that holds an optical apparatus without applying a large force to the optical element or using a material that generates harmful gas, such as adhesive, an optical apparatus having the holding mechanism, and a device manufacturing method.

A holding mechanism according to one aspect of the present invention for holding an optical element includes a rear side block that includes a rear side holding engagement part that is engageable with a rear side engagement part provided on a rear side of an optical element or a holding member that is fixed onto the optical element, and a front side block that is coupled with the rear side block and includes a front side holding engagement part that is engageable with a front engagement part provided on a front side of the optical element or the holding member, wherein one of the rear side engagement part and the rear side holding engagement part has a groove and the other has a spherical part that has an at least partially spherical shape engageable with the groove, and wherein one of the front side engagement part and the front side holding engagement part has another groove and the other has another spherical part that has an at least partially spherical shape engageable with the other groove.

An exposure apparatus according to another aspect of the present invention includes an illumination optical system for introducing light from a light source to a reticle, a projection optical system for projecting a pattern of a reticle onto a substrate, and the above holding mechanism for holding an optical element in one of the illumination and projection optical systems.

A device manufacturing method according to still another aspect of the present invention includes the steps of exposing an object using the above exposure apparatus, and developing the object that has been exposed.

Other objects and further features of the present invention will become readily apparent from the following description of the preferred embodiments with reference to the accompanying drawings.

BRIEF DESCRIPTION OF THE DRAWINGS

FIG. 5A is an enlarged view of a principal part of a lens holder according to a second embodiment of the present invention.

FIG. 5B is an exploded perspective view of a pair of blocks that serve to hold the lens and is used for the lens holder shown in FIG. 5A.

FIG. 5C is a partially enlarged perspective view of V-grooves formed in an outer circumference of the lens.

DETAILED DESCRIPTION OF THE PREFERRED EMBODIMENTS

Referring now to the accompanying drawings, a description will be given of various embodiments according to the present invention.

First Embodiment

Figure 1A:
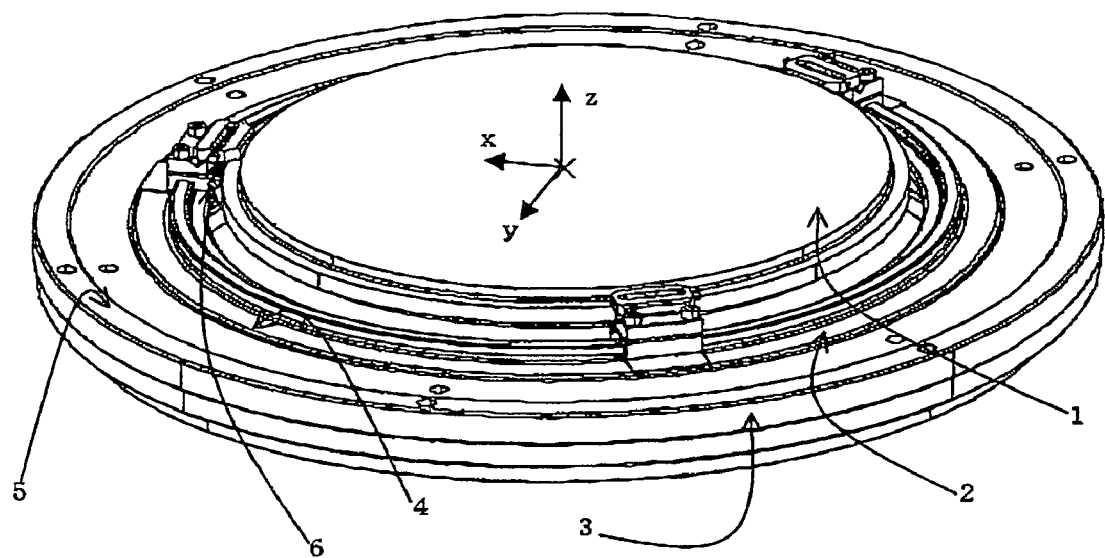
FIG. 1A is a perspective overview of a lens holder according to a first embodiment of the present invention.
Figure 1B:
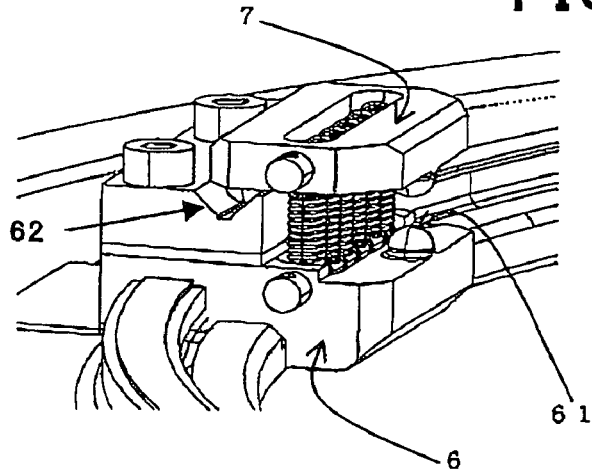
FIG. 1B is a partially enlarged perspective view of a block shown in FIG. 1A that serves to hold the lens.

A description will be given of a holding mechanism according to a first embodiment according to the present invention, with reference to the drawings. FIG. 1A is a perspective overview of a lens holder or mechanism according to the first embodiment of the present invention. FIG. 1B is a partially enlarged perspective view of a rear side block 6 that serves to hold the lens. A projection optical system in a semiconductor exposure apparatus, for example, includes plural sets of the lens holders and lenses held by the lens holders. The gravity direction accords with the optical axis, more specifically, the −Z direction shown in FIG. 1A.

In FIG. 1A, reference numeral 1 denotes a lens that can be made of one selected from various materials, such as quartz, calcium fluoride, and another material whose transmittance to the ultraviolet ("UV") light having a wavelength of 200 nm or smaller is similar to that of quartz and calcium fluoride. Reference numeral 2 denotes a ring member that holds the lens 1. This embodiment makes the ring member 2 of an invar material that has an extremely small coefficient of thermal expansion relative to the coefficient of linear expansion of the lens 1. For example, a difference between the coefficient of thermal expansion of the invar material and the coefficient of linear expansion of the lens 1 is 20%, preferably 10%, of the coefficient of linear expansion of the lens 1. Reference numeral 3 denotes a holding member that is made of an iron material and supports both the lens 1 and another lens similarly held by this lens 1 substantially coaxially (although the two lenses may be slightly decentered for aberrational corrections). Plural peripheral portions of the ring member 2 are notched, and plural elastic members or flat springs 4 are provided there. Each flat spring 4 is arranged so that its flat plane is approximately orthogonal to a radial direction of a circle around the optical axis of the lens 1, although it is sufficient that part of the flat spring is approximately orthogonal to the radial direction. This configuration allows for deformations in a direction approximately perpendicular to the optical axis of the lens 1. In other words, when the flat spring 4 deforms, the ring member 2 and the holding member 3 displace only in a radial direction of the lens 1, substantially perpendicular to the optical axis. The elastic member 4 is connected to the ring member 2 at both ends of its plate, and to the holding member 3 at its center part. Of course, it may be connected to the ring member 2 at its center part, and to the holding member at its both ends. This support structure provides each elastic member 4 to have such a low elasticity modulus or a high rigidity in a radial direction of the optical element that the elastic member 4 does not substantially deform in the optical-axis direction of the lens 1.

Reference numeral 5 denotes a spacer that adjusts an arrangement of a barrel unit in the optical-axis direction, which includes the lens 1, the ring member 2, the holding member 3, and the elastic member 4. As is illustrated in FIG. 1A, the holding member 3 and the spacer 5 are provided with screw holes used to fasten bolts arranged at a pitch of 60° in the circumferential direction. Positions between the lens 1 and the spacer 5 are fixed at an arbitrary angle for each pitch of 60° in each barrel unit so that they can be moved and fixed within an interval between the bolt hole and the bolt in a direction perpendicular to the optical axis.

Reference numeral 6 denotes a block provided at three points along the circumference of the ring member 2. The block 6 has a rear side spherical part 61, and a coupling groove 62 on its top surface, which extends in the tangential direction of the lens 1. Here, the "rear side" means the −Z direction side of the lens 1. While this embodiment blazes the spherical part 61 onto the block 6, the spherical part 61 may be adhered to the block 6 through the epoxy adhesive agent having little degas or integrated with the block 6.

Figure 2A:
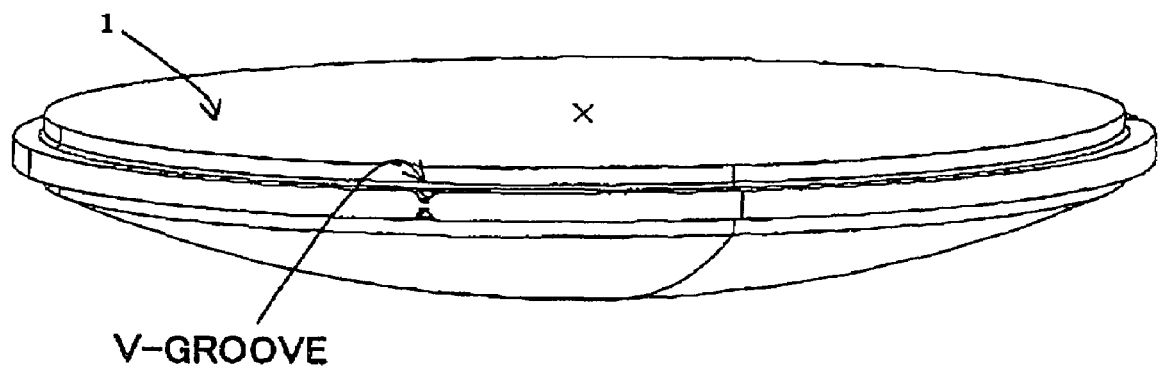
FIG. 2A is a perspective view of the lens shown in FIG. 1A.
Figure 2B:
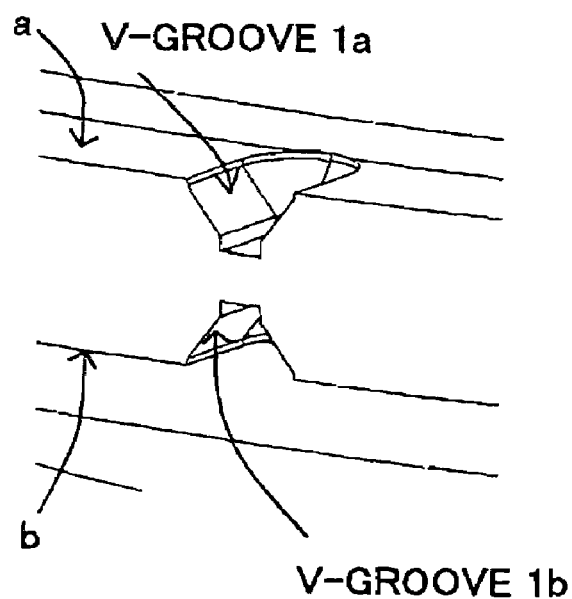
FIG. 2B is a partially enlarged view of a V-groove shown in FIG. 2A provided in an outer circumference of a lens.

FIG. 2A is a perspective overview of the lens 1, and FIG. 2B is a partially enlarged view of a pair of V-shaped grooves ("V-grooves") 1a and 1b formed at three points at a pitch of 120° along the outer circumference of the lens 1, on a pair of plane "a" and "b" that are formed by cutting operations. Each of the V-grooves 1a and 1b extends in the radial direction, and an angle formed by two planes that forms the V shape is between 20° and 180°. While the V-groove may be directly formed on lens polishing surfaces, it is preferable to work the V-grooves 1a and 1b on the step-shaped planes other than the polishing surfaces, as in this embodiment, so as to minimize the distortion of the lens surface due to the compressive load. When the spherical parts 61 are engaged with the rear side V-grooves 1b at the bottom surface side of the lens 1, the lens 1 is kinetically fixed onto the blocks 6, except in the +Z direction.

Figure 3:
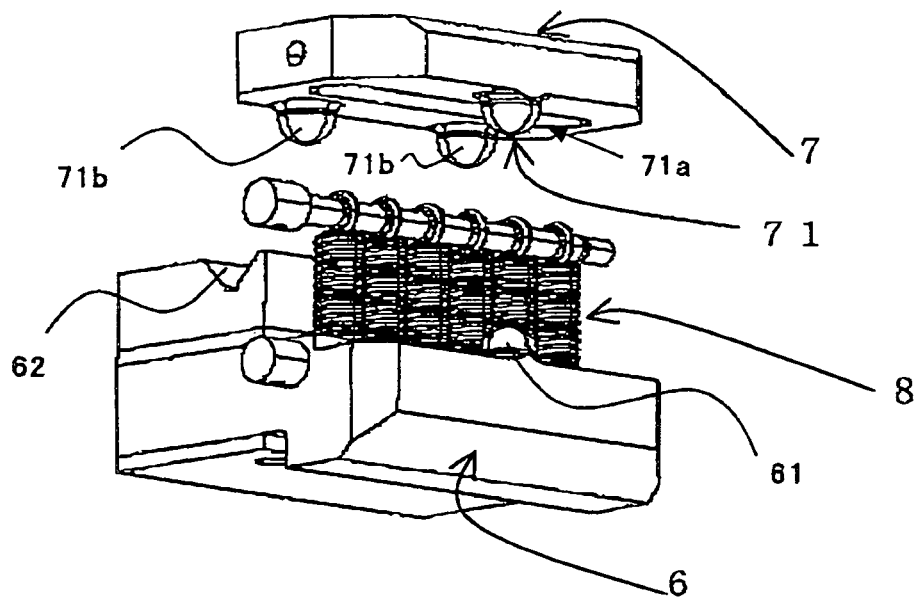
FIG. 3 is an exploded perspective view of the block shown in FIG. 1B.

Contact portions of the V-grooves 1b, which the spherical parts 61 contact, maintain a high surface precision through precision lapping, improving the positioning reproducibility in repetitively loading and unloading the lens 1. A restraint unit or front side block 7 contacts the V-groove 1a on the top surface side of the lens 1 and restrains movements of the lens 1 in the +Z direction. The restraint unit 7 has three spherical parts 71 (i.e., 71a and 71b) that define the same plane as shown in FIG. 3. One spherical part 71a in each restraint unit 7 is engaged with the V-groove 1a of the lens 1, and is referred to as a front side spherical part. Here, the "front side" means the +Z direction side of the lens 1. In addition, this embodiment refers to the remaining two spherical parts 71b that contact the coupling groove 62 in the block 6 as coupling spherical parts. These three spherical parts 71 may be formed by bonding or integrated with the block 7. When the front side spherical part 71 among the three spherical parts 71 contacts the front side V-groove 1$a$ on the top surface of the lens 1 and the remaining two coupling spherical parts 71$b$ contact the coupling groove 62 in the block 6, the restraint unit 7 is kinetically mounted. As each restraint unit 7 is drawn in the gravity direction by coil springs 8, the lens 1 is fixed between two opposing types of spherical parts 61 and 71$a$. The tensile force of the coil spring 8 is optimized in view of the lens rigidity, lens weight, permissible birefringence amount, the impact values applied when the lens 1 is manufactured and transported, but, generally, in the range of 3 to 60 N.

The coil spring 8 has a low rigidity in a direction other than the tensile direction, and restraint unit 7 does not receive an excessive force in the XY in-plane directions. In other words, lens 1 simply receives only the compressive force in the optical-axis direction, and the distortion amount of the lens surface due to the fixing force of the lens 1 can be maintained to be at a minimum.

The measurement results of the birefringence amount that occurs when the load is applied to the lens demonstrate that the birefringence amount associated with the load directing from the lens peripheral direction to the optical-axis direction is less than the birefrincence amount associated with the load directing from the outer circumference of the lens to the center. It is thus clear that a fixing method that compresses the lens in the optical-axis direction, as in this embodiment, is advantageous even in terms of the birefringence characteristic.

Figure 4A:
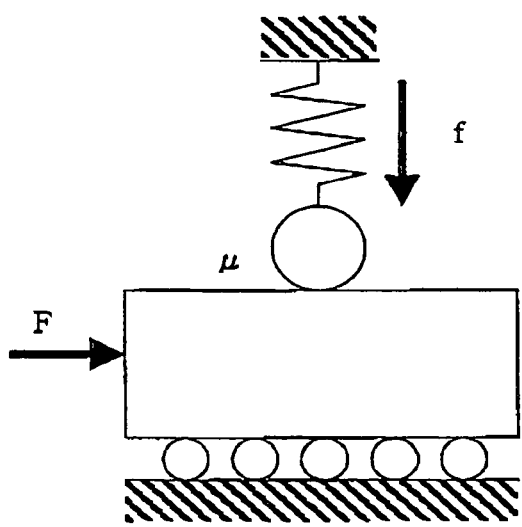
FIG. 4A shows a model of an object, which applies a vertical load to a top plane of the object.
Figure 4B:
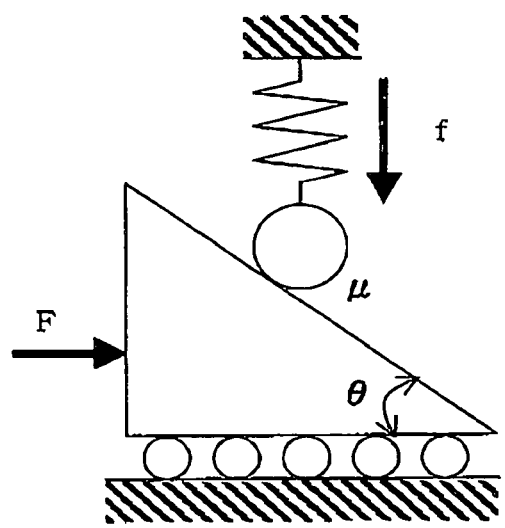
FIG. 4B shows a model of another object, which applies a load to a slope of the object, such as a groove, as in this embodiment.

FIGS. 4A and 4B are explanatory views for explaining a condition that an object subject to a horizontal external force generates a positional offset when a vertical pressure attempts to fix the object by a frictional force. FIG. 4A is a model that applies a vertical load onto the top plane of the object, and FIG. 4B is a model that applies a load to a slope, such as a groove, as in this embodiment. In the model shown in FIG. 4A, the object moves in the horizontal direction when $F > \mu f$ is met, where f is a vertical compressive force, and $\mu$ is a coefficient of static friction. On the other hand, in the model shown in FIG. 4B, the object moves in the horizontal direction when $F > f(\sin\theta + \mu\cos\theta/(\cos\theta - \mu\sin\theta)$ is met.

In the model shown in FIG. 4B, the condition that the object does not move irrespective of the horizontal force F is determined by an angle of the slope in the V-groove and the coefficient of static friction. However, when $\mu$ is about 0.1 and $0 < \theta < 80°$ ($\cos\theta - \mu\sin\theta > 0$ in this range), $(\sin\theta + \mu\cos\theta)/(\cos\theta - \mu\sin\theta) > \mu$. Therefore, it is understood that the model shown in FIG. 4B always provides a higher horizontal holding power than that of the model shown in FIG. 4A, which applies the load onto the horizontal plane.

This embodiment sets the inclined angle $\theta$ of the V-groove in the lens 1 to $\pi/4$ and $\mu$ to about 0.1 ($\cos\theta - \mu\sin\theta > 0$ in this range), and $(\sin\theta + \mu\cos\theta)/(\cos\theta - \mu\sin\theta)$ becomes 1.22. Therefore, the lens 1 is held in place irrespective of the larger external horizontal force than the model that compresses the horizontal plane of the object.

Second Embodiment

Referring to FIGS. 5A, 5B and 5C, a description will be given of a holding mechanism according to a second embodiment of the present invention. FIG. 5A is an enlarged view of a principal part of a lens holder or mechanism according to the second embodiment of the present invention. FIG. 5B is an exploded perspective view of the blocks 6 and 7 that serve to hold the lens 1 and is used for this lens holder. FIG. 5C is a partially enlarged perspective view of three V-grooves 1$c$ and 1$b$ formed in the outer circumference of the lens 1. The lens holder and the lens held by this lens holder constitute a projection optical system in a semiconductor exposure apparatus, for example. Those elements in FIGS. 5A–5C, which are corresponding elements in the first embodiment, are designated by the same reference numerals, and a detailed description thereof will be omitted.

A restraint unit 7 contacts a pair of V-grooves 1$c$ at the top surface side of the lens 1 and restrains movement of the lens 1 in the optical-axis direction or +Z direction. The restraint unit 7 has three spherical parts 71 (i.e., 71$c$ and 71$c$) that define the same plane. In the first embodiment, one spherical part 71$a$ contacts the V-groove 1$a$ at the top surface side of the lens 1, and the remaining two spherical parts 71$b$ contact the coupling groove 62 in the block 6. On the other hand, the second embodiment forms a pair of V-grooves 1$c$ in the lens 1 and one V-groove 1$b$ at the rear side. The V-grooves 1$c$ are engaged with the spherical parts 71$c$, while the V-groove 1$b$ is engaged with the spherical part 61 as in the first embodiment.

A pair of V-grooves 1$c$ at the lens side are angled, i.e., not parallel to each other, and the restraint unit 7 is kinetically mounted. These two V-grooves 1$c$ in the top surface of the lens 1 are preferably symmetrical with respect to a predetermined plane that includes the optical axis.

This configuration can disperse the compressive load necessary to fix the lens per a single point, and further reduce the birefringence amount that occurs in the lens 1. A large distance between two points that compress the top surface of the lens 1 could deform the lens surface out of the plane (antiplane deformation). Therefore, the distance between the two points is optimized so that the deformation is ignorable. This embodiment sets the distance between the two points to 30 mm or smaller, and confirms that the set distance provides an optically ignorable antiplane deformation caused by the compressive load.

Third Embodiment

Figure 6A:
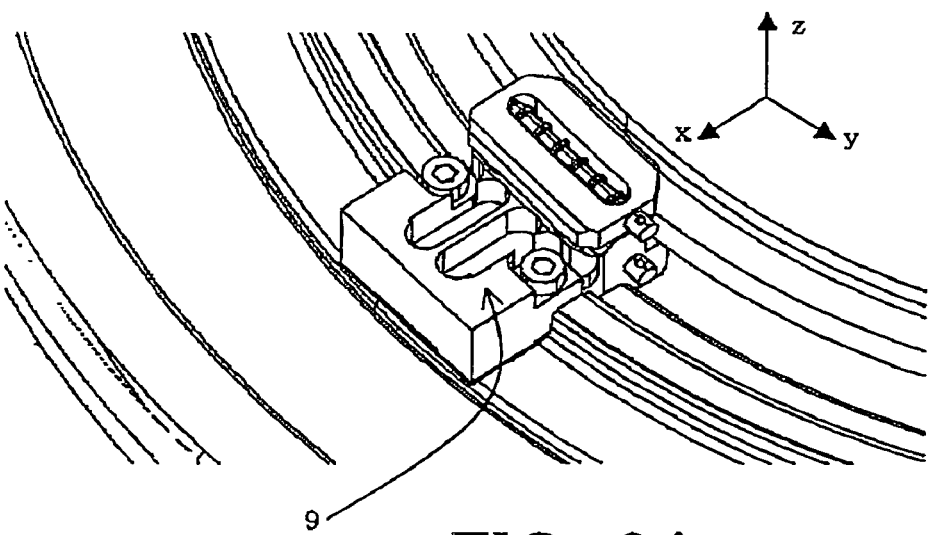
FIG. 6A is a partially enlarged view of a principal part of a lens holder according to a third embodiment of the present invention.
Figure 6B:
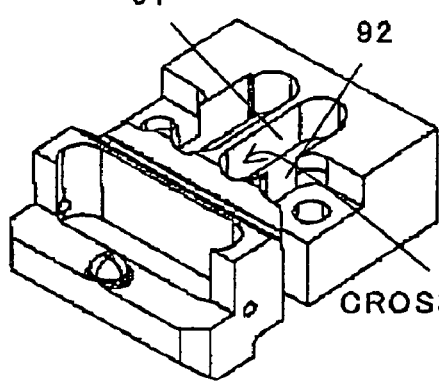
FIG. 6B is a perspective overview of a cross spring block, which serves to hold a lens and is used for the lens holder shown in FIG. 6A, when the cross spring block is viewed from its top surface.
Figure 6C:
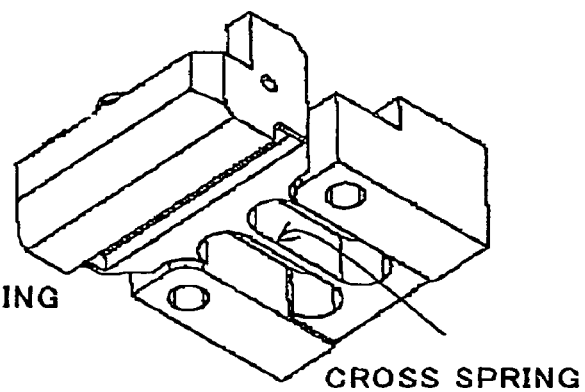
FIG. 6C is a perspective overview of the cross spring block shown in FIG. 6B, when the cross spring block is viewed from its bottom surface.

Referring to FIGS. 6A, 6B and 6C, a description will be given of a holding mechanism according to a third embodiment of the present invention. FIG. 6A is a partially enlarged view of a principal part of a lens holder or mechanism according to the third embodiment of the present invention. FIG. 6B is a perspective overview of a cross spring block 9 that serves to hold the lens and is used for this lens holder when the cross spring block 9 is viewed from its top surface. FIG. 6C is a perspective overview of the cross spring block 9 shown in FIG. 6B, when the cross spring block 9 is viewed from its bottom surface. The lens holder and the lens held by this lens holder constitute a projection optical system in a semiconductor exposure apparatus, for example. Those elements in FIGS. 6A–6C, which are corresponding elements in the first embodiment, are designated by the same reference numerals, and a detailed description thereof will be omitted.

A cross spring block 9 provides a sectionally cross elastic member near a fixing portion between the ring member 2 and the block 6 shown in the first embodiment. More specifically, the cross spring block 9 has a first flat member 91 perpendicular to a radial direction of the lens 1, and a second flat member 92 perpendicular to a circumferential direction of the lens 1. The first flat member allows deformations of the lens mainly in the circumferential direction, and the second flat member allows deformations of the lens mainly in the radial direction. As the block attachment part of the ring member 2 deforms in a rotational direction around the radial direction, the cross elastic member can twist and is less likely to transmit the deformation of the ring member 2 to the lens 1. This configuration can prevent the deterioration of the lens performance due to the external forces applied to the optical system in manufacturing and transporting the lens 1.

Figure 7:
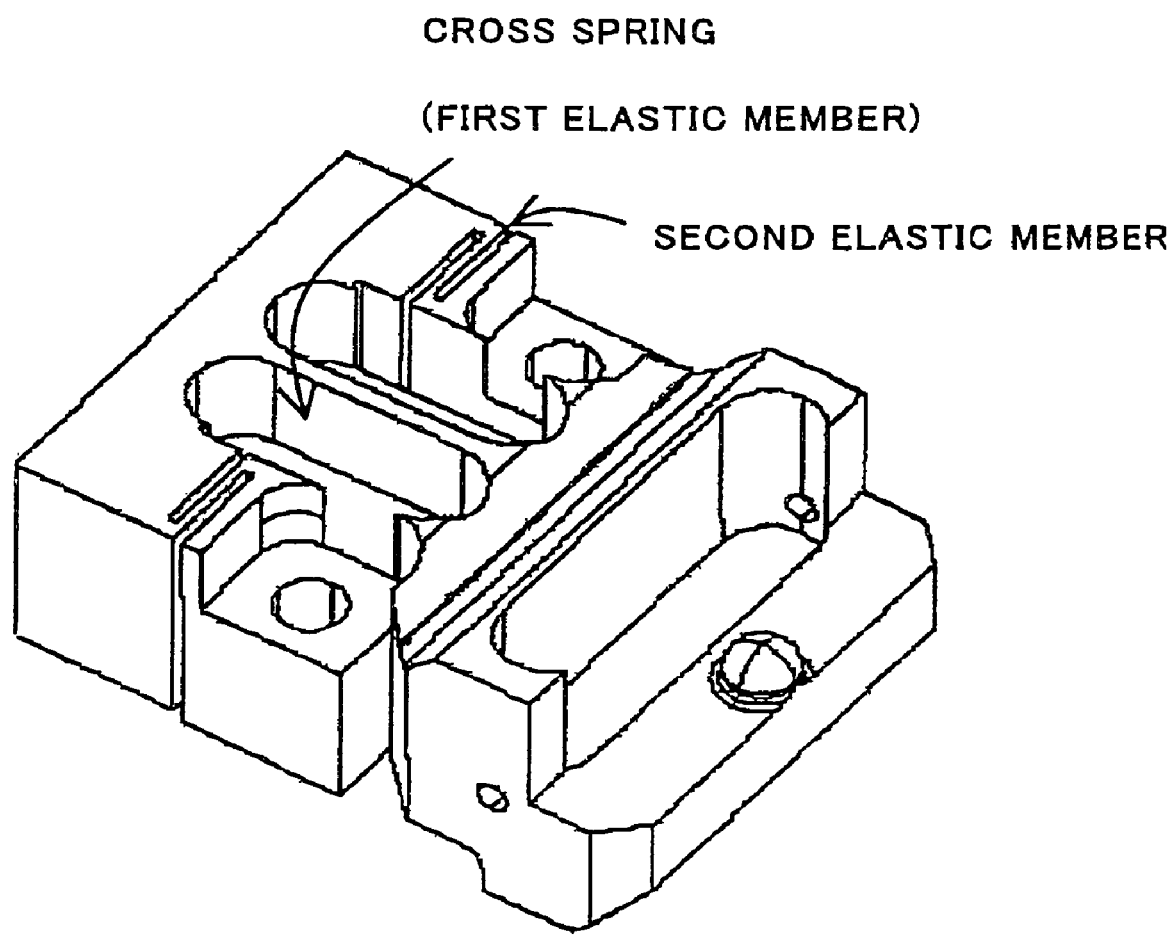
FIG. 7 is a perspective overview of another embodiment of a cross spring block according to a third embodiment of the present invention.

The interval can be so small between the optical elements in the projection optical system that it is difficult to couple the ring member 2 with the holding member 3. In that case, one equivalent structure is, as shown in FIG. 7, a cross spring that may have a second elastic member that provides an elasticity in the X direction in addition to the torsion. While the third embodiment modifies the first embodiment, the third embodiment is applicable to the second embodiment.

Although the first to third embodiments provide the spherical parts to the holding mechanism side and the grooves to the lens (optical element) side, this positional relationship may be inversed. In addition, although the first to third embodiments form the grooves in the lens (optical element) side, the grooves may be provided in the lens holding member that has a fixed positional relationship with the lens 1 and engaged with the above spherical parts. Of course, the positional relationship between the grooves, and the spherical parts may be inversed. The rear surface of the lens 1 may have the grooves and the front surface of the lens 1 may have the spherical parts; the positional relationship between the grooves and the spherical parts may be inversed. In this case, the grooves or spherical parts may be formed at the holding mechanism side in accordance with the shape of the lens 1.

Fourth Embodiment

Figure 8:
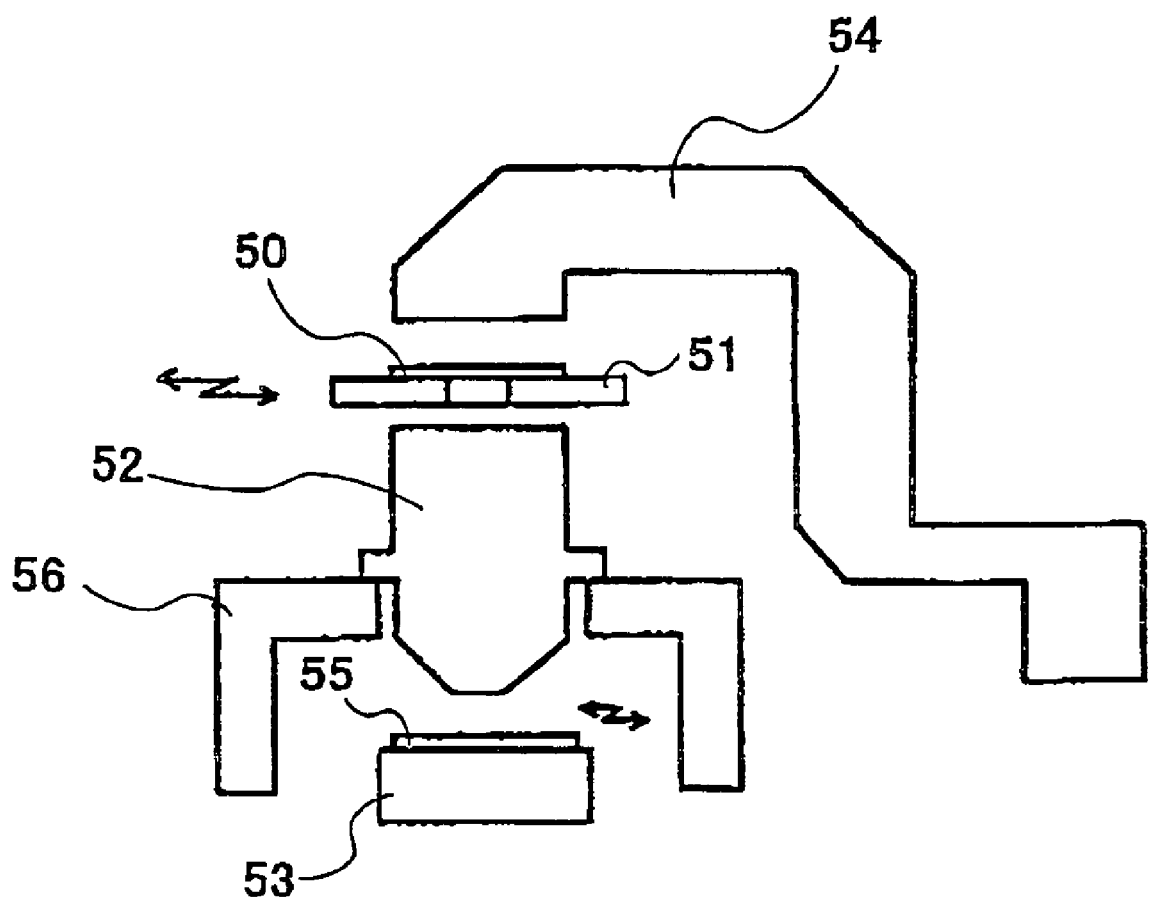
FIG. 8 is a block diagram of a principal structure in an exposure apparatus according to a fourth embodiment according to the present invention.
Figure 9:
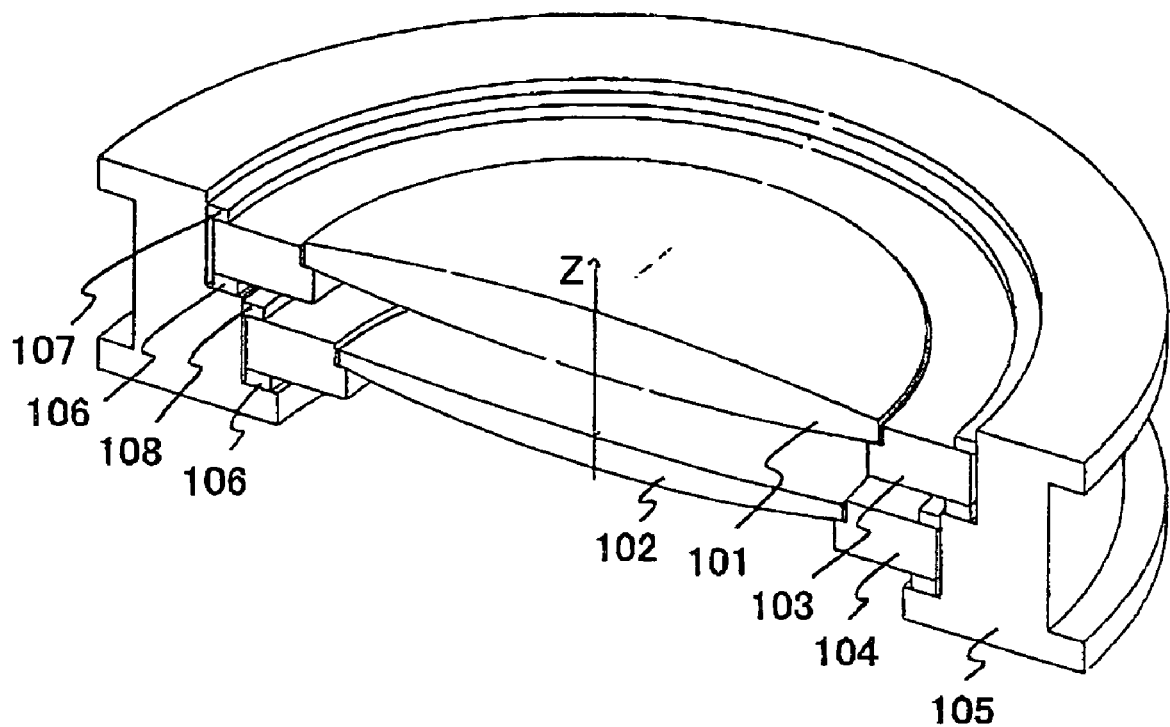
FIG. 9 is a partially sectional and perspective view of a barrel structure for an optical system in a conventional semiconductor exposure apparatus.

FIG. 8 is a block diagram showing a principal structure of a semiconductor exposure apparatus S that applies the lens holder as the inventive holding mechanism. The exposure light from a light source (not shown) is introduced to a reticle 50 held on a reticle stage 51 via an illumination optical system 54. The exposure light that passes the reticle 50 reaches a wafer (substrate) 55 as an object to be exposed held on a wafer stage 53 via a projection optical system 52 that is held by a frame 56. Thus, a circuit pattern of the reticle is projected onto the wafer 55. The projection optical system 52 uses plural lenses that are held by the inventive lens holder. Of course, the lens holder is applicable to a lens in the illumination optical system 54.

Fifth Embodiment

Figure 10:
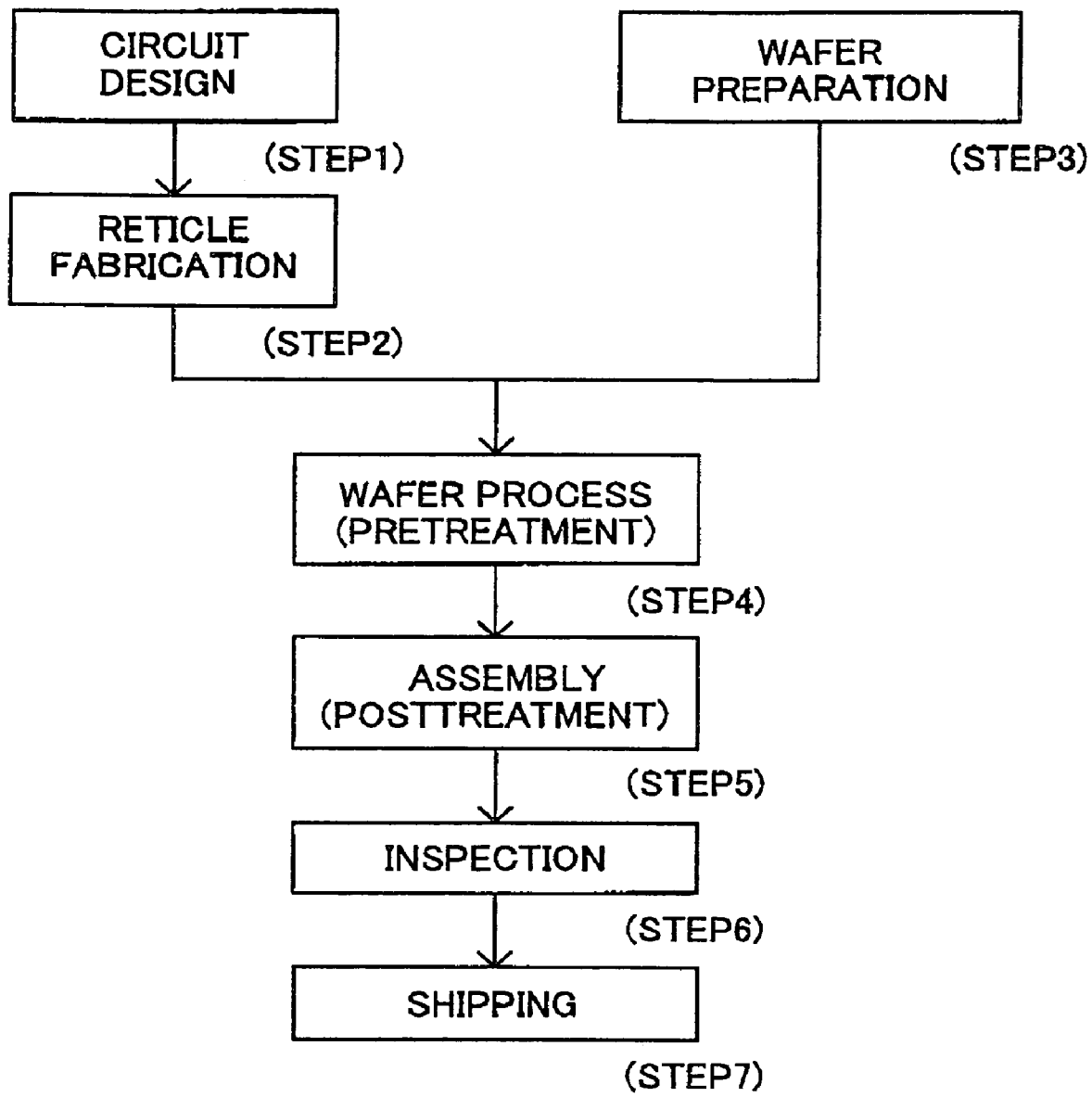
FIG. 10 is a flowchart for explaining a device manufacturing method that utilizes the exposure apparatus shown in FIG. 8.
Figure 11:
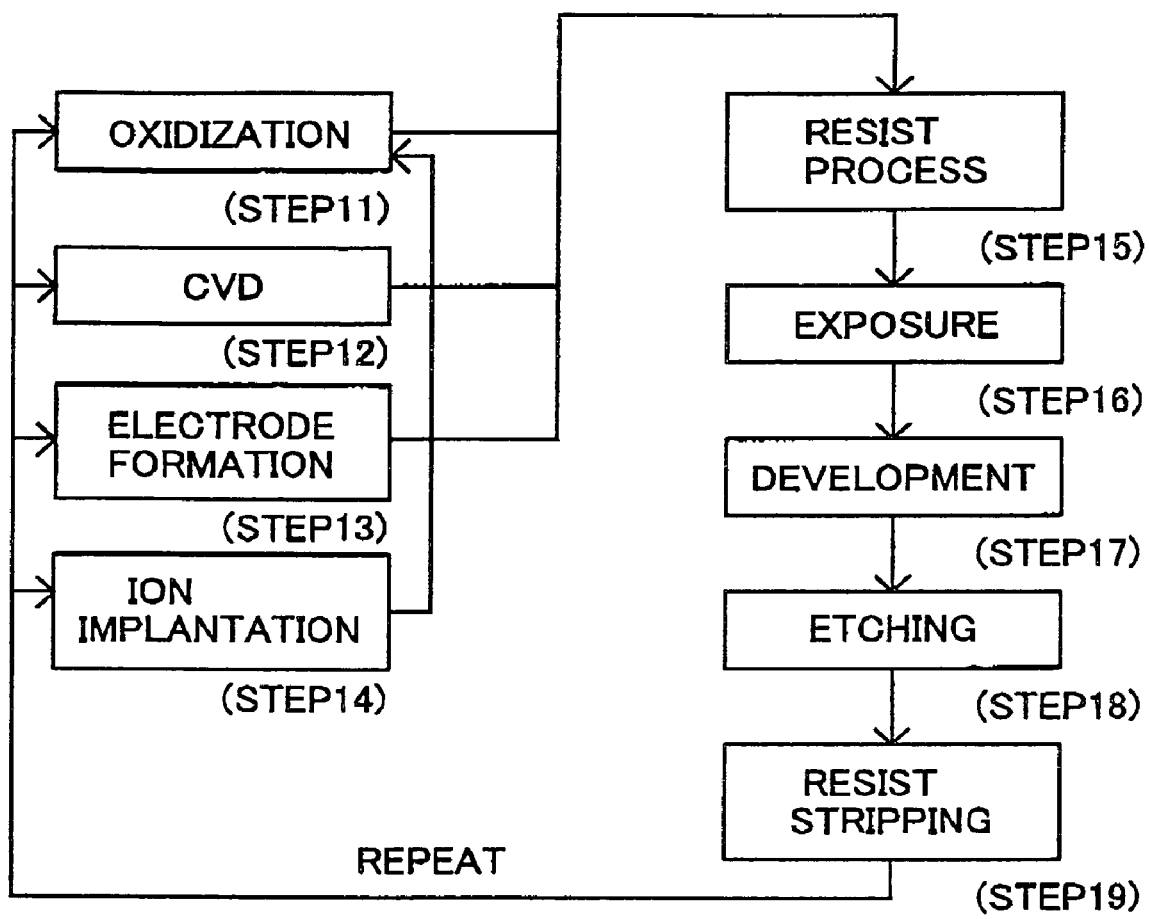
FIG. 11 is a detailed flowchart for Step 104 shown in FIG. 10.

Referring to FIGS. 10 and 11, a description will now be given of an embodiment of a device manufacturing method using the above exposure apparatus S. FIG. 10 is a flowchart for explaining a fabrication of devices (i.e., semiconductor chips, such as ICs and LSIs, LCDs, CCDs, etc.). Here, a description will be given of fabrication of a semiconductor chip as an example. Step 1 (circuit design) designs a semiconductor device circuit. Step 2 (reticle fabrication) forms a reticle having a designed circuit pattern. Step 3 (wafer preparation) manufactures a wafer using a material such as silicon. Step 4 (wafer process), which is referred to as a pretreatment, forms actual circuitry on the wafer through lithography using the reticle and wafer. Step 5 (assembly), which is also referred to as a post-treatment, forms the wafer formed in Step 4 into a semiconductor chip and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 11 is a detailed flowchart of the wafer process shown in Step 4. Step 11 (oxidation) oxidizes the surface of the wafer. Step 12 (CVD) forms an insulating film on the surface of the wafer. Step 13 (electrode formation) forms electrodes on the wafer by vapor deposition, and the like. Step 14 (ion implantation) implants ions into the wafer. Step 15 (resist process) applies a photosensitive material to the wafer. Step 16 (exposure) uses the exposure apparatus to expose a circuit pattern of the reticle onto the wafer. Step 17 (development) develops the exposed wafer. Step 18 (etching) etches parts other than a developed resist image. Step 19 (resist stripping) removes the unused resist after etching. These steps are repeated, and multilayer circuit patterns are formed on the wafer. The device manufacturing method of this embodiment may manufacture higher quality devices than do conventional ones.

Furthermore, the present invention is not limited to these preferred embodiments, and various variations and modifications may be made without departing from the scope of the present invention.

The above embodiments can stably position an optical element, such as a lens, in place without applying a large force to the optical element or without using a material that generates a harmful gas, such as an adhesive agent. Therefore, a projection optical system in an exposure apparatus, for example, that utilizes the inventive holding mechanism provides a stable exposure characteristic that can reduce the deterioration of the transmittance due to the contaminations and little aberration, and realizes high quality transferring with a high resolving power, thereby manufacturing fine semiconductors. In addition, the inventive holding mechanism allows the manufacture and maintenance operation of the exposure apparatus to exchange a single lens quickly, improving the yield.

While the above embodiments discuss a projection lens system in the semiconductor exposure apparatus as an example, the optical element may be a mirror, a diffraction optical element, and another optical element whose optical characteristic can deteriorate due to deformation and degas, in addition to a lens.

CLAIM OF PRIORITY

This application claims foreign priority benefit based on Japanese Patent Application No. 2004-280997, filed on Sep. 28, 2004, which is hereby incorporated by reference herein in its entirety as if fully set forth herein.

What is claimed is:

1. A holding mechanism for holding an optical element, said holding mechanism comprising:
    a rear side block that includes a rear side holding engagement part that is engageable with a rear side engagement part provided on a rear side of an optical element or a holding member that is fixed onto the optical element; and
    a front side block that is coupled with said rear side block and includes a front side holding engagement part that is engageable with a front engagement part provided on a front side of the optical element or the holding member, wherein one of the rear side engagement part and the rear side holding engagement part has a groove and the other has a spherical part that has an at least partially spherical shape engageable with the groove, and wherein one of the front side engagement part and the front side holding engagement part has another groove and the other has another spherical part that has an at least partially spherical shape engageable with the other groove.

2. A holding mechanism according to claim 1, further comprising an elastic member for connecting the front side block with the rear side block, and forcing the front side block against the rear side block, allowing an expansion of the optical element in an optical-axis direction.

3. A holding mechanism according to claim 1, wherein one of the rear and front side blocks has a coupling groove that extends in a tangential direction of a circle around an optical axis, and the other of the rear and front side blocks has a projecting coupling spherical part that is at least partially spherical and engageable with the coupling groove.

4. A holding mechanism according to claim 3, wherein the number of spherical parts is one each of the front and rear side blocks and the number of coupling spherical parts is two, or the number of spherical parts is two each of the front and rear side blocks and the number of coupling spherical parts is one.

5. A holding mechanism according to claim 3, further comprising an elastic member for forcing the coupling spherical part against the coupling groove.

6. A holding mechanism according to claim 1, wherein at least one of the grooves and the other grooves has a V shape, and an angle formed by two planes that forms form the V shape is between 20° and 180°.

7. A holding mechanism according to claim 6, wherein the two planes that form the V shape are formed by precision lapping.

8. An exposure apparatus comprising:
    an illumination optical system for introducing light from a light source to a reticle;
    a projection optical system for projecting pattern of a reticle onto a substrate; and
    a holding mechanism according to claim 1 for holding an optical element in one of said illumination and projection optical systems.

9. A device manufacturing method comprising the steps of:
    exposing an object using an exposure apparatus according to claim 8; and
    developing the object that has been exposed.

* * * * *